United States Patent
Park et al.

(10) Patent No.: US 8,024,646 B2
(45) Date of Patent: Sep. 20, 2011

(54) APPARATUS AND METHOD FOR RECEIVING SIGNAL IN A COMMUNICATION SYSTEM

(75) Inventors: Sung-Eun Park, Seoul (KR); Hong-Sil Jeong, Seoul (KR); Jae-Yoel Kim, Suwon-si (KR); Dong-Seek Park, Yongin-si (KR); Kyeong-Cheol Yang, Seoul (KR)

(73) Assignee: Samsung Electronics Co., Ltd. (KR)

(*) Notice: Subject to any disclaimer, the term of this patent is extended or adjusted under 35 U.S.C. 154(b) by 1159 days.

(21) Appl. No.: 11/804,644

(22) Filed: May 18, 2007

(65) Prior Publication Data

US 2008/0005643 A1 Jan. 3, 2008

(30) Foreign Application Priority Data

May 20, 2006 (KR) .................. 10-2006-0045419

(51) Int. Cl.
 *G06F 11/00* (2006.01)
(52) U.S. Cl. ........................................ 714/800
(58) Field of Classification Search .................. 714/786, 714/796, 788, 800–801; 370/297, 340
 See application file for complete search history.

(56) References Cited

U.S. PATENT DOCUMENTS

| 5,446,747 | A  | * | 8/1995 | Berrou ......................... 714/788 |
| 6,192,503 | B1 | * | 2/2001 | Chennakeshu et al. ....... 714/796 |
| 7,590,195 | B2 | * | 9/2009 | Wang et al. ................... 375/340 |

FOREIGN PATENT DOCUMENTS

KR 1020040000060 1/2004

\* cited by examiner

*Primary Examiner* — Shelly A Chase
(74) *Attorney, Agent, or Firm* — The Farrell Law Firm, P.C.

(57) ABSTRACT

A signal reception apparatus for a communication system is disclosed in which the signal reception apparatus receives a signal and decodes the received signal using a second decoding scheme approximated from a first decoding scheme. The second decoding scheme is a scheme of applying a correction value to a third decoding scheme approximated from the first decoding scheme, and the correction value is a value for correcting a difference between a first signal obtained by decoding the received signal using the first decoding scheme and a second signal obtained by decoding the received signal using the third decoding scheme.

14 Claims, 7 Drawing Sheets

APPARATUS AND METHOD FOR RECEIVING SIGNAL IN A COMMUNICATION SYSTEM

PRIORITY

This application claims priority under 35 U.S.C. §119(a) to a Korean Patent Application filed in the Korean Intellectual Property Office on May 20, 2006 and assigned Serial No. 2006-45419, the disclosure of which is incorporated herein by reference.

BACKGROUND OF THE INVENTION

1. Field of the Invention

The present invention relates generally to a communication system, and, in particular, to an apparatus and method for receiving signals in a communication system.

2. Description of the Related Art

Generally, communication systems have developed to provide terminals capable of providing high-speed, high-capacity data transmission/reception services. Therefore, the communication systems consider using Low Density Parity Check (LDPC) codes, which are channel codes suitable for high-speed, high-capacity data transmission/reception.

With reference to the block diagram of FIG. 1, a description is provided of a signal transmission apparatus in a general communication system using LDPC codes. Referring to FIG. 1, the signal transmission apparatus includes an encoder 111, a modulator 113 and a transmitter 115. If desired transmission information data, i.e. information vector s, is generated in the signal transmission apparatus, the information vector s is delivered to the encoder 111. The encoder 111 generates a codeword vector c, i.e. LDPC codeword, by encoding the information vector s using a predetermined coding scheme and outputs the codeword vector c to the modulator 113. Herein, the coding scheme is an LDPC coding scheme. The modulator 113 generates a modulation vector m by modulating the codeword vector c using a predetermined modulation scheme and outputs the modulation vector m to the transmitter 115. The transmitter 115 performs transmission signal processing on the modulation vector m output from the modulator 113 and transmits the processed signal to a signal reception apparatus via an antenna.

With reference to the block diagram of FIG. 2, a description will now be made of a structure of a signal reception apparatus in a general communication system using LDPC codes.

Referring to FIG. 2, the signal reception apparatus includes a receiver 211, a demodulator 213 and a decoder 215. A signal transmitted by a signal transmission apparatus is received at the signal reception apparatus via an antenna, and the signal received via the antenna is delivered to the receiver 211. The receiver 211 performs reception signal processing on the received signal and outputs the processed reception vector r to the demodulator 213. The demodulator 213 demodulates the reception vector r output from the receiver 211 using a demodulation scheme corresponding to a modulation scheme used in a modulator, i.e. modulator 113, of the signal transmission apparatus and outputs the resulting demodulation vector x to the decoder 215. The decoder 215 decodes the demodulation vector x output from the demodulator 213 using a decoding scheme corresponding to a coding scheme used in an encoder, i.e. encoder 111, of the signal transmission apparatus, and outputs the decoded signal as a finally restored information vector ŝ. Herein, the decoding scheme, i.e. LDPC decoding scheme, uses an iterative decoding algorithm based on a sum-product algorithm, a detailed description of which is provided below.

The LDPC code is defined by a parity check matrix in which the major elements have a value of '0' and the minor elements except for the elements having a value of '0' have a non-zero value, for example, a value of '1'. The LDPC code can be expressed with a bipartite graph, and the bipartite graph is expressed with variable nodes, check nodes and edges connecting the variable nodes to the check nodes.

In addition, the LDPC code can be decoded in the bipartite graph using the iterative decoding algorithm based on the sum-product algorithm. The sum-product algorithm is a kind of a message passing algorithm, and the term 'message passing algorithm' refers to an algorithm of exchanging messages through the edges in the bipartite graph, and calculating and updating output messages from the messages input to the variable nodes or the check nodes.

With reference to the block diagram of FIG. 3, a description will now be made of a message passing operation in an arbitrary check node of a decoder using a general LDPC decoding scheme (hereinafter 'LDPC decoder').

FIG. 3 shows a check node #m 300 and a plurality of variable nodes 310, 320, 330 and 340 connected to the check node #m 300. In addition, $T_{n,m}$ indicates a message passing from a variable node #n' 310 to the check node #m 300, and $E_{n,m}$ indicates a message passing from the check node #m 300 to a variable node #n 330. Herein, a set of all variable nodes connected to the check node #m 300 is defined as N(m) and a set determined by excluding the variable node #n 330 from N(m) is defined as N(m)\n. In this case, a message update rule based on the sum-product algorithm can be expressed as Equation (1):

$$|E_{n,m}| = \Phi\left[\sum_{n' \in N(m)\backslash n} \Phi(|T_{n',m}|)\right] \quad (1)$$

$$\text{Sign}(E_{n,m}) = \prod_{n' \in N(m)\backslash n} \text{sign}(T_{n',m})$$

In Equation (1), $\text{Sign}(E_{n,m})$ denotes a sign of a message $E_{n,m}$, $|E_{n,m}|$ denotes a magnitude of the message $E_{n,m}$, and a function $\Phi(x)$ can be expressed as Equation (2):

$$\Phi(x) = -\log\left(\tanh\left(\frac{x}{2}\right)\right) \quad (2)$$

With reference to the block diagram of FIG. 4, a description will now be made of an internal structure of a general LDPC decoder.

Referring to FIG. 4, the LDPC decoder includes a first memory 400, a check node processor 410 and a second memory 420. The first memory 400 stores the messages to be input to the check node processor 410, and the second memory 420 stores the messages output from the check node processor 410. The first memory 400 includes a plurality of, for example, dc sub-memories of a sub-memory #1 ($M_1$) 400-1 to a sub-memory #dc ($M_{dc}$) 400-dc. The second memory 420 includes a plurality of, for example, dc sub-memories of a sub-memory #1 ($M'_1$) 420-1 to a sub-memory #dc ($M'_{dc}$) 420-dc. Although the memory for storing the messages to be input to the check node processor 410 and the memory for storing the messages output from the check node processor 410 are implemented with separate memories in FIG. 4, by way of example, the memory for storing the messages to be input to the check node processor 410 and the memory for storing the messages output from the check node processor 410 can be implemented with the same memory.

If an input dimension of the check node processor 410 is assumed to be dc, the dc input messages are stored in the sub-memory #1 ($M_1$) 400-1 to the sub-memory #dc ($M_{dc}$) 400-dc, and the output messages mapped to the dc input messages are stored in the sub-memory #1 ($M'_1$) 420-1 to the sub-memory #dc ($M'_{dc}$) 420-dc.

As described in FIGS. 3 and 4, in the message passing algorithm, the sum-product algorithm described in Equation (1) is an optimal scheme for decoding an LDPC code that can be expressed with a bipartite graph having no cycle. However, the use of the sum-product algorithm considerably increases complexity of implementation of check node processing (or check node operation), making the implementation difficult. Therefore, there is a need for an LDPC code decoding scheme for reducing complexity of check node processing.

SUMMARY OF THE INVENTION

An aspect of the present invention is to address at least the problems and/or disadvantages described above and to provide at least the advantages described below. Accordingly, an aspect of the present invention is to provide an apparatus and method for receiving signals in a communication system using LDPC codes.

Another, aspect of the present invention is to provide a signal reception apparatus and method for decoding an LDPC code with minimum complexity of check node processing in a communication system using LDPC codes.

According to one aspect of the present invention, there is provided a signal reception apparatus for a communication system. The signal reception apparatus receives a signal, and decodes the received signal using a second decoding scheme approximated from a first decoding scheme. The second decoding scheme is a scheme of applying a correction value to a third decoding scheme approximated from the first decoding scheme, and the correction value is a value for correcting a difference between a first signal obtained by decoding the received signal using the first decoding scheme and a second signal obtained by decoding the received signal using the third decoding scheme.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention provides a signal reception apparatus and method for decoding a Low Density Parity Check (LDPC) code with minimum complexity of check node processing in a communication system using LDPC codes. As described above, in the message passing algorithm, the sum-product algorithm is an optimal scheme for decoding an LDPC code that can be expressed with a bipartite graph having no cycle. However, use of the sum-product algorithm considerably increases complexity of implementation of check node processing (or check node operation), making the implementation difficult. Therefore, use of a scheme for decoding an LDPC code using approximated check node processing which is lower in complexity than check node processing of the sum-product algorithm can be considered.

In this case, the messages processed through the approximated check node processing, compared with the messages processed through the check node processing of the sum-product algorithm, are generally over-estimated or under-estimated. The over-estimated or under-estimated messages cause degradation of decoding performance of the LDPC codes. In addition, the over-estimated or under-estimated messages are different in the extent of the over-estimation or under-estimation according to channel status.

Therefore, the present invention provides a signal reception apparatus and method for decoding an LDPC code by allowing the over-estimated or under-estimated messages to be normally estimated. In particular, the present invention provides a signal reception apparatus and method for decoding an LDPC code by allowing the over-estimated or under-estimated messages to be normally estimated, taking channel status into account.

With reference to the block diagram of FIG. 5, a description will now be made of a structure of a signal reception apparatus in a communication system using LDPC codes according to an embodiment of the present invention.

Figure 1:
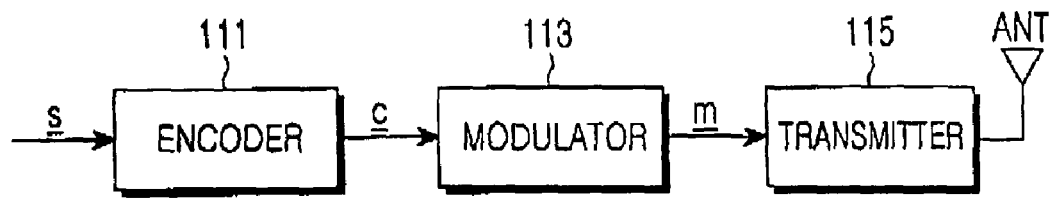
FIG. 1 is a block diagram illustrating a structure of a signal transmission apparatus in a general communication system using LDPC codes.
Figure 2:
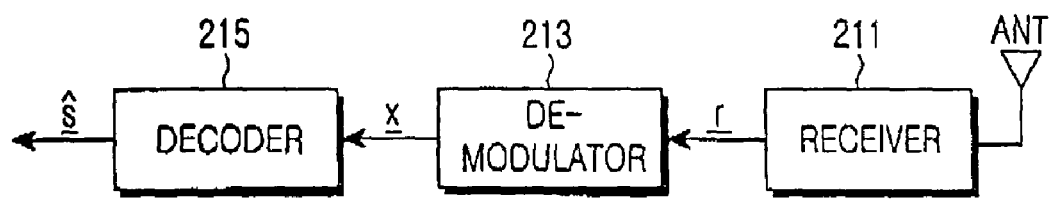
FIG. 2 is a block diagram illustrating a structure of a signal reception apparatus in a general communication system using LDPC codes.
Figure 3:
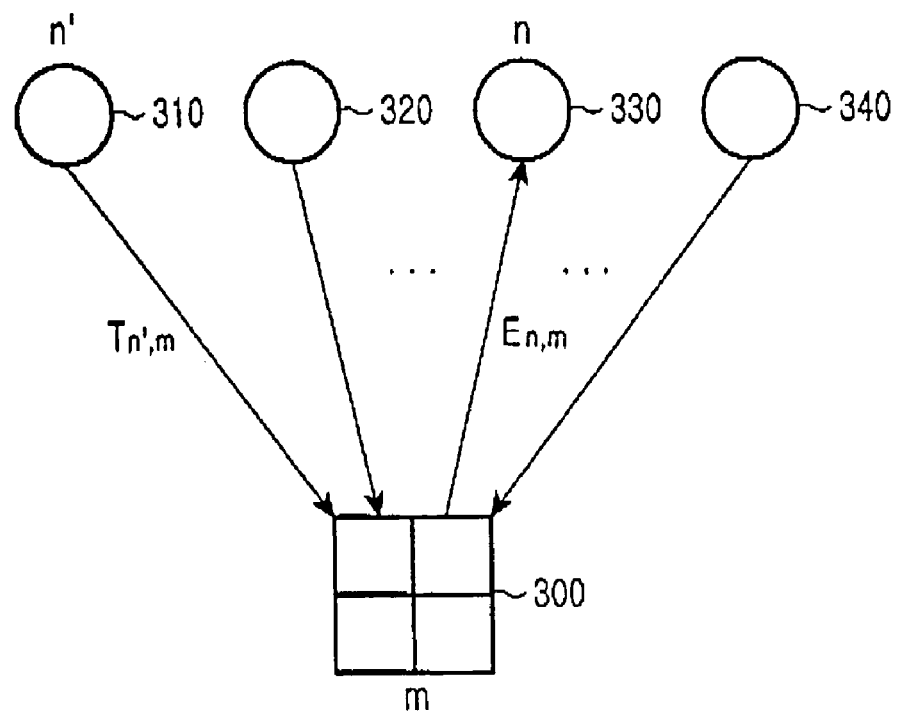
FIG. 3 is a block diagram illustrating a message passing operation in an arbitrary check node of a general LDPC decoder.
Figure 4:
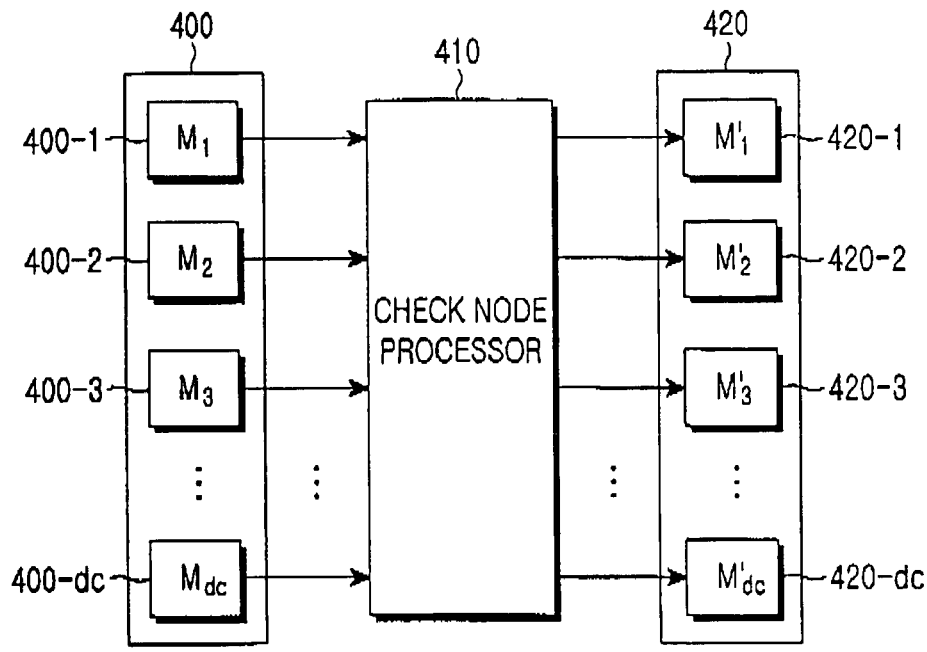
FIG. 4 is a block diagram illustrating an internal structure of a general LDPC decoder.
Figure 5:
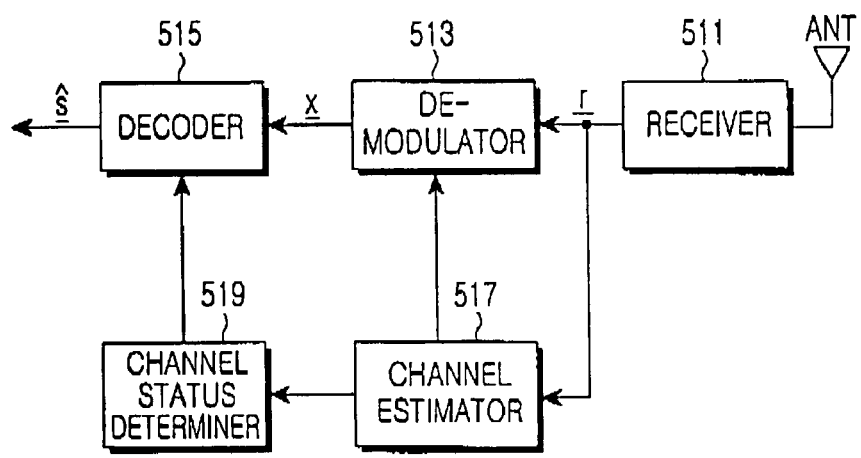
FIG. 5 is a block diagram illustrating a structure of a signal reception apparatus in a communication system using LDPC codes according to an embodiment of the present invention.

Assuming that a signal transmission apparatus of the communication system is equal in structure to the signal transmission apparatus described in FIG. 1, and referring to FIG. 5, the signal reception apparatus includes a receiver 511, a demodulator 513, a decoder 515, a channel estimator 517 and a channel status decider 519.

The signal transmitted by the signal transmission apparatus is received at the signal reception apparatus via an antenna, and the signal received via the antenna is delivered to the receiver 511. The receiver 511 performs reception signal processing on the received signal and outputs the processed reception vector r to the demodulator 513 and the channel estimator 517. The channel estimator 517 performs channel estimation on the input reception vector r using a predetermined channel estimation scheme to estimate a channel value and outputs the estimated channel value to the demodulator 513 and the channel status decider 519. The channel estimation scheme is not directly related to the present invention, so a detailed description thereof will be omitted herein.

The demodulator 513 demodulates the reception vector r output from the receiver 511 and the estimated channel value output from the channel estimator 517 using a demodulation scheme corresponding to the modulation scheme used in a modulator, i.e. modulator 113, of the signal transmission apparatus, and outputs a demodulation vector x to the decoder 515. The channel status determiner 519 determines a channel status value from the estimated channel value output from the channel estimator 517 using a predetermined channel status decision scheme, and outputs the determined channel status value to the decoder 515. The channel status decision scheme is not directly related to the present invention, so a detailed description thereof will be omitted herein.

The decoder 515 encodes the demodulation vector x output from the demodulator 513 and the channel status value output from the channel status determiner 519 using a decoding scheme corresponding to the coding scheme used in an encoder, i.e. encoder 111 of the signal transmission apparatus, and outputs the decoded signal as a finally restored information vector ŝ. Herein, the decoding scheme, i.e. LDPC decoding scheme, is a scheme of using an iterative decoding algorithm based on the sum-product algorithm, approximated based on channel status, and the iterative decoding algorithm approximated based on the channel status will be described in detail hereinbelow.

In the signal reception apparatus of FIG. 5, the demodulator 513 generates the demodulation vector x by demodulating the reception vector r using the estimated channel value, and the decoder 515 generates the restored information vector ŝ by decoding the demodulation vector x using the channel status value, by way of example. However, it is also possible to decode an LDPC code by allowing the over-estimated or under-estimated messages to be normally estimated in the method of the present invention, even though the demodulator 513 and the decoder 515 do not use the estimated channel value and the channel status value. However, when the estimated channel value and the channel status value are used as described in FIG. 5, it is possible to decode an LDPC code so as to improve its performance, because the channel status can be considered to allow the over-estimated or under-estimated messages to be normally estimated.

Figure 6:
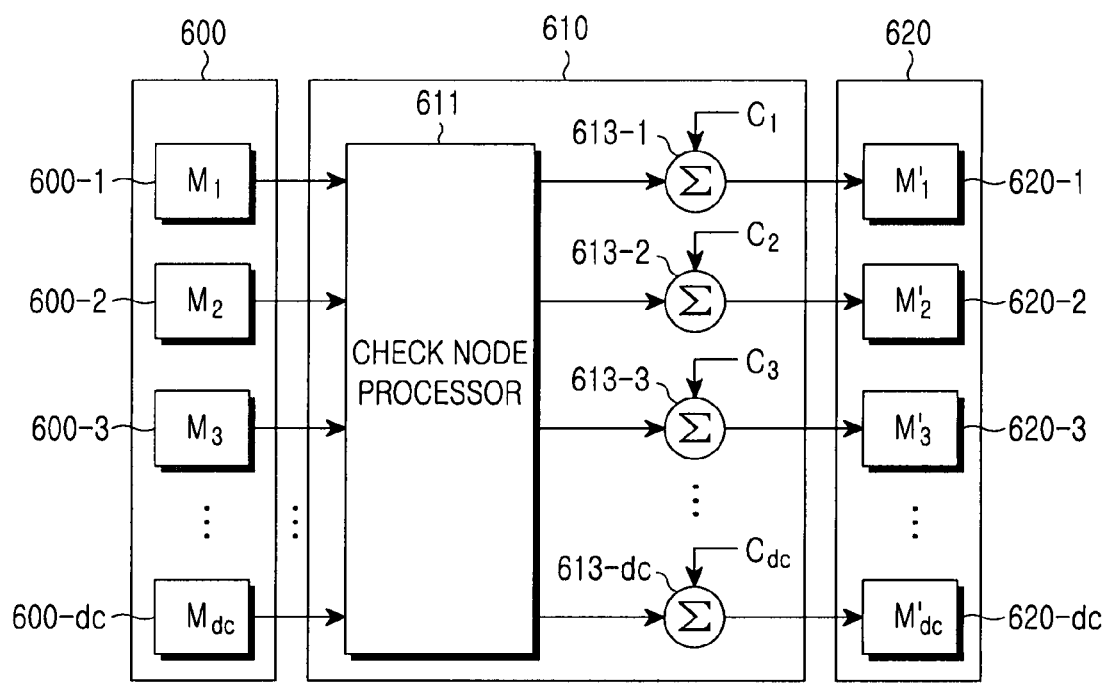
FIG. 6 is a block diagram illustrating a first example of an internal structure of an LDPC decoder according to an embodiment of the present invention.
Figure 7:
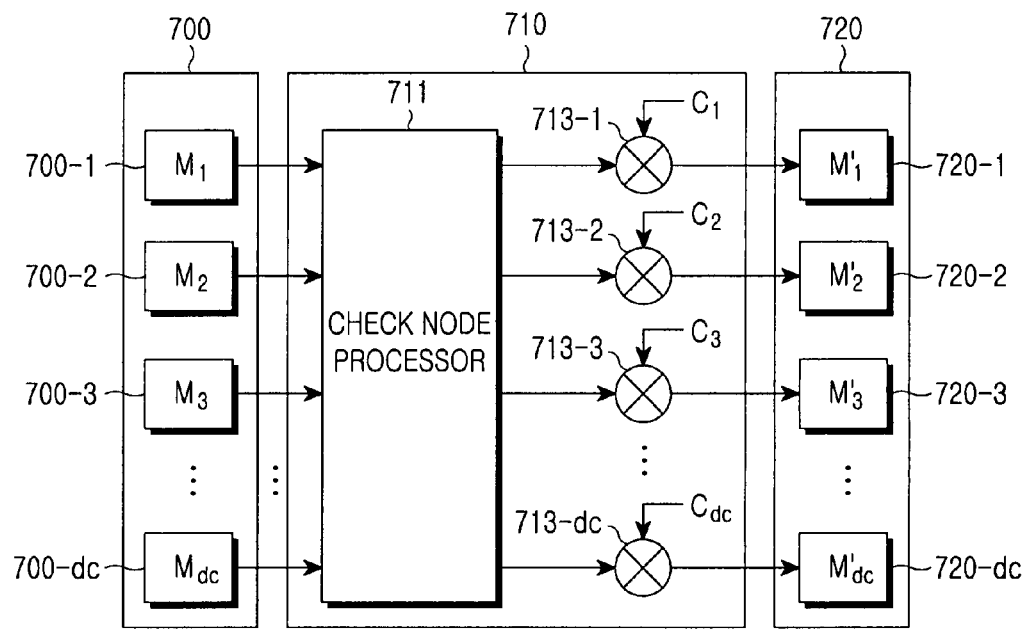
FIG. 7 is a block diagram illustrating a second example of an internal structure of an LDPC decoder according to an embodiment of the present invention.
Figure 8:
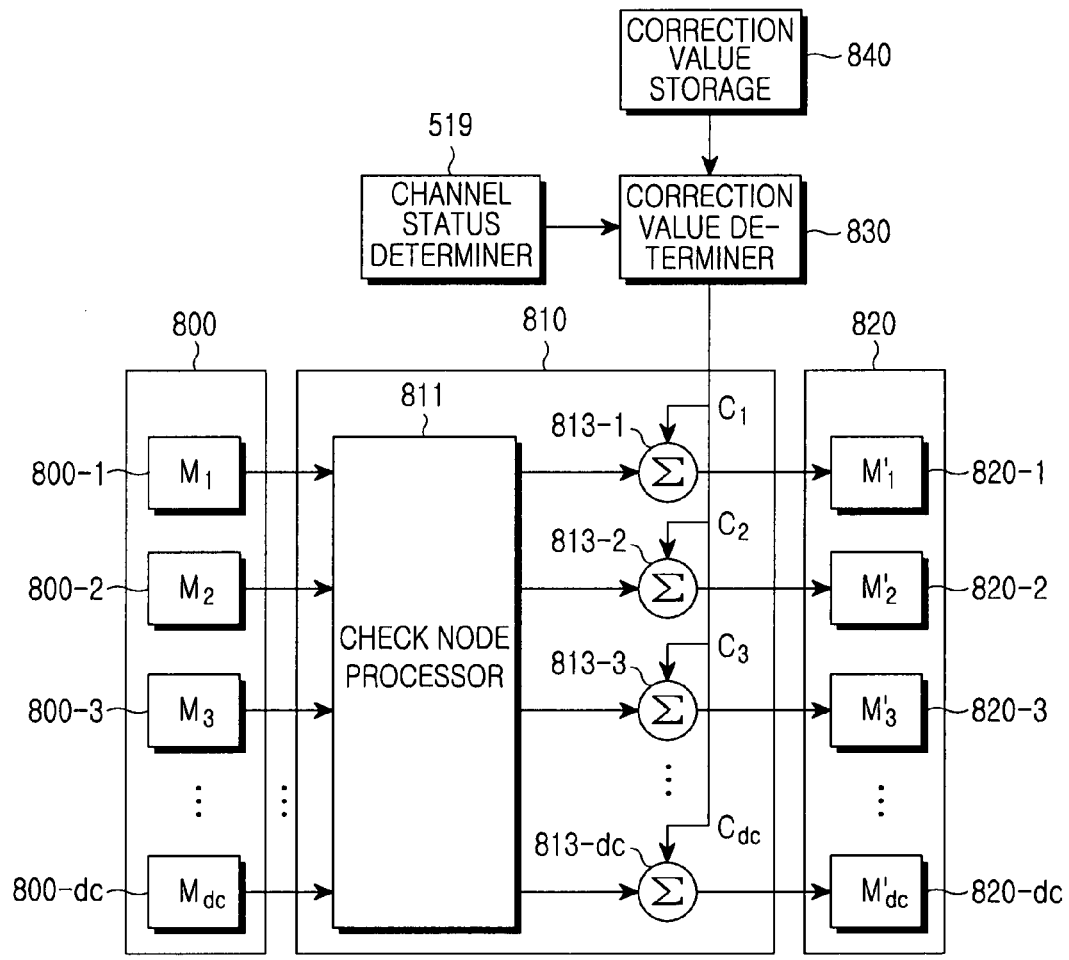
FIG. 8 is a block diagram illustrating a third example of an internal structure of an LDPC decoder according to an embodiment of the present invention.
Figure 9:
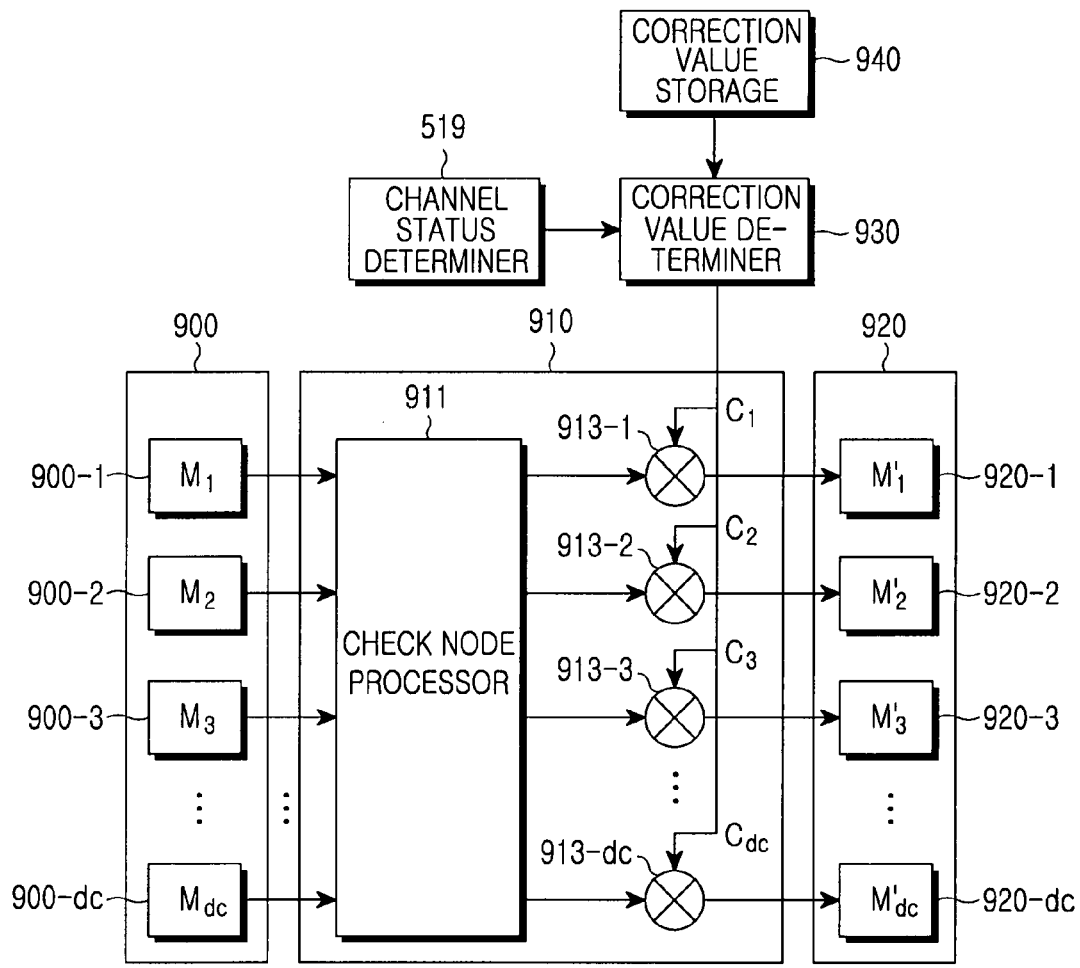
FIG. 9 is a block diagram illustrating a fourth example of an internal structure of an LDPC decoder according to an embodiment of the present invention.

With reference to FIGS. 6 to 9, a description is provided of an internal structure of a decoder using an LDPC decoding scheme (hereinafter referred to as an 'LDPC decoder') according to an embodiment of the present invention. Before a description of FIGS. 6 to 9 is given, it should be noted that an internal structure of an LDPC decoder described in FIGS. 6 and 7 is for decoding an LDPC code by allowing over-estimated or under-estimated messages to be normally estimated without taking the estimated channel value and the channel status value into account, and an internal structure of an LDPC decoder described in FIGS. 8 and 9 is for decoding an LDPC code by allowing over-estimated or under-estimated messages to be normally estimated, taking the estimated channel value and the channel status value into account.

FIG. 6 is a block diagram illustrating a first example of an internal structure of an LDPC decoder according to an embodiment of the present invention.

Referring to FIG. 6, the LDPC decoder includes a first memory 600, a check node processor 610 and a second memory 620. The check node processor 610 includes a check node processing unit 611, and a plurality of, for example, dc adders 613-1 to 613-$dc$ (adders #1 to dc). The first memory 600 stores the messages to be input to the check node processor 610, and the second memory 620 stores the messages output from the check node processor 610. In addition, the first memory 600 includes a plurality of, for example, dc sub-memories of a sub-memory 600-1 to 600-$dc$ ($M_1$ to $M_{dc}$), and the second memory 620 includes a plurality of, for example, dc sub-memories of sub-memory 620-1 to 620-$dc$ ($M'_1$ to $M'_{dc}$). Although the memory for storing the messages to be input to the check node processor 610 and the memory for storing the messages output from the check node processor 610 are implemented with separate memories in FIG. 6, by way of example, the memory for storing the messages to be input to the check node processor 610 and the memory for storing the messages output from the check node processor 610 can be implemented with the same memory.

If an input dimension of the check node processor 610 is assumed to be dc, the dc input messages are stored in sub-memory $M_1$ 600-1 to sub-memory $M_{dc}$ 600-$dc$, and the output messages mapped to the dc input messages are stored in sub-memory $M'_1$ 620-1 to sub-memory $M'_{dc}$ 620-$dc$.

The check node processing unit 611 performs check node processing on the messages output from the sub-memories $M_1$ 600-1 to $M_{dc}$ 600-$dc$ using a check node processing scheme defined in an LDPC decoding scheme used in the LDPC decoder, i.e. an LDPC decoding scheme corresponding to the iterative decoding algorithm based on the approximated sum-product algorithm. The check node processing unit 611 outputs, to adders 613-1 to 613-$dc$, the messages updated depending on the check node processing results for the messages output from the sub-memories $M_1$ 600-1 to $M_{dc}$ 600-$dc$. Adders 613-1 to 613-$dc$ add predetermined correction values to the messages output from the check node processing unit 611 and output the resulting values to sub-memory $M'_1$ 620-1 to $M'_{dc}$ 620-$dc$, respectively.

The correction values $C_1$ to $C_{dc}$ added in adders 613-1 to 613-$dc$ can be set equal to or different from each other. Herein, if the LDPC decoding scheme is a scheme of generating under-estimated messages as compared with the iterative decoding algorithm based on the sum-product algorithm, the correction values are set as positive values to generate the under-estimated messages to be equal to the normally estimated messages. To the contrary, if the LDPC decoding scheme is a scheme of generating over-estimated messages as compared with the iterative decoding algorithm based on the sum-product algorithm, the correction values are set as negative values to generate the over-estimated messages to be equal to the normally estimated messages.

With reference to the block diagram of FIG. 7, a description will now be made of a second example of an internal structure of an LDPC decoder according to an embodiment of the present invention. The internal structure of the LDPC decoder shown in FIG. 7 is similar to the internal structure of the LDPC decoder shown in FIG. 6, except that the correction values undergo multiplication rather than addition. That is, although the messages output from the check node processing unit 611 are input to adders 613-1 to 613-$dc$ in FIG. 6, the messages output from the check node processing unit 711 are input to multipliers 713-1 to 713-$dc$ in FIG. 7. Therefore, if the LDPC decoding scheme is a scheme of generating under-estimated messages as compared with the iterative decoding algorithm based on the sum-product algorithm, the correction values are set in FIG. 7 as positive values greater than '1' to generate the under-estimated messages to be equal to the normally estimated messages. To the contrary, if the LDPC decoding scheme is a scheme of generating over-estimated messages as compared with the iterative decoding algorithm based on the sum-product algorithm, the correction values are set in FIG. 7 as positive values less than '1' to generate the over-estimated messages to be equal to the normally estimated messages.

With reference to the block diagram of FIG. 8, a description will now be made of a third example of an internal structure of an LDPC decoder according to an embodiment of the present invention.

The internal structure of the LDPC decoder shown in FIG. 8 is similar to the internal structure of the LDPC decoder shown in FIG. 6, except that it further includes a correction value determiner 830 and a correction value storage 840. That is, although the correction values $C_1$ to $C_{dc}$ are preset values in FIG. 6, the correction values $C_1$ to $C_{dc}$ are determined by the correction value determiner 830 in FIG. 8. A detailed description will now be made of an operation of the correction value determiner 830.

The correction value determiner 830 determines correction values $C_1$ to $C_{dc}$ with the correction values stored in the correction value storage 840 according to the channel status value determined by the channel status determiner 519. The correction value storage 840 stores the correction values that the check node processor 810 should use according to the channel status values, and the correction values can be stored in a table format according to the channel status values.

With reference to the block diagram of FIG. 9, a description will now be made of a fourth example of an internal structure of an LDPC decoder according to an embodiment of the present invention.

The internal structure of the LDPC decoder shown in FIG. 9 is similar to the internal structure of the LDPC decoder shown in FIG. 8, except that the correction values undergo multiplication rather than addition. That is, although the messages output from the check node processing unit 811 are input to adders 813-1 to 813-$dc$ in FIG. 8, the messages output from the check node processing unit 911 are input to multipliers 913-1 to 913-$dc$ in FIG. 9.

In addition, although the present invention has been described with reference to a scheme of allowing the over-estimated or under-estimated messages to be normally estimated in the communication system using LDPC codes, the proposed scheme of allowing the over-estimated or under-estimated messages to be normally estimated can be used in any communication system using not only the LDPC code but also other codes.

As is apparent from the foregoing description, the present invention can decode an LDPC code with minimum check node processing complexity in the communication system using LDPC code. In addition, when the communication system decodes an LDPC code using the approximated check node processing scheme, the present invention corrects the over-estimated or under-estimated messages to be normally estimated, thereby preventing degradation of decoding performance. Further, when the communication system decodes an LDPC code using the approximated check node processing scheme; the present invention corrects the over-estimated or under-estimated messages to be normally estimated, taking even the channel status into account, thereby preventing degradation of decoding performance.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for receiving a signal in a signal reception apparatus of a communication system, the method comprising:
   receiving a signal; and
   decoding the received signal using a second decoding scheme approximated from a first decoding scheme,
   wherein the second decoding scheme applies a correction value to a third decoding scheme approximated from the first decoding scheme, and the correction value is a value for correcting a difference between a first signal obtained by decoding the received signal using the first decoding scheme and a second signal obtained by decoding the received signal using the third decoding scheme.

2. The method of claim 1, wherein the second decoding scheme adds the correction value to the second signal or multiplies the second signal by the correction value.

3. The method of claim 2, wherein the first decoding scheme is a Low Density Parity Check (LDPC) decoding scheme that uses an iterative decoding algorithm based on a sum-product algorithm.

4. The method of claim 1, wherein the correction value is determined according to a channel status under a specific control.

5. The method of claim 4, further comprising:
   generating an estimated channel value by performing channel estimation on the received signal using a channel estimation scheme;
   generating a channel status value by determining a channel status from the estimated channel value using a channel status decision scheme; and
   determining the correction value according to the channel status value.

6. The method of claim 5, wherein the second decoding scheme adds the correction value to the second signal or multiplies the second signal by the correction value.

7. A signal reception apparatus for a communication system, the apparatus comprising:
   a decoder for decoding a received signal using a second decoding scheme approximated from a first decoding scheme,
   wherein the second decoding scheme applies a correction value to a third decoding scheme approximated from the first decoding scheme, and the correction value is a value for correcting a difference between a first signal obtained by decoding the received signal using the first decoding scheme and a second signal obtained by decoding the received signal using the third decoding scheme.

8. The signal reception apparatus of claim 7, wherein the second decoding scheme adds the correction value to the second signal or multiplies the second signal by the correction value.

9. The signal reception apparatus of claim 8, wherein the first decoding scheme is a Low Density Parity Check (LDPC) decoding scheme that uses an iterative decoding algorithm based on a sum-product algorithm.

10. The signal reception apparatus of claim 9, wherein the decoder comprises:
    a check node processing unit for performing check node processing on a plurality of messages included in the received signal using the third decoding scheme; and
    a plurality of adders for adding the correction value to each check-node-processed message, or a plurality of multipliers for multiplying each check-node-processed message by the correction value.

11. The signal reception apparatus of claim 9, wherein the decoder comprises:
- a check node processing unit for performing check node processing on a plurality of messages included in the received signal using the third decoding scheme;
- a correction value determiner for determining the correction value according to the channel status value; and
- a plurality of adders for adding the determined correction value to each check-node-processed message, or a plurality of multipliers for multiplying each check-node-processed message by the determined correction value.

12. The signal reception apparatus of claim 7, wherein the correction value is determined according to a channel status under a specific control.

13. The signal reception apparatus of claim 12, wherein the second decoding scheme adds the correction value to the second signal or multiplies the second signal by the correction value.

14. The signal reception apparatus of claim 13, further comprising:
- a channel estimator for generating an estimated channel value by performing channel estimation on the received signal using a channel estimation scheme; and
- a channel status determiner for generating a channel status value by determining a channel status from the estimated channel value using a channel status decision scheme,
- wherein the decoder determines the correction value according to the channel status value.

* * * * *